(12) United States Patent
Natzle et al.

(10) Patent No.: US 7,955,926 B2
(45) Date of Patent: Jun. 7, 2011

(54) STRUCTURE AND METHOD TO CONTROL OXIDATION IN HIGH-K GATE STRUCTURES

(75) Inventors: Wesley C. Natzle, New Paltz, NY (US); Renee T. Mo, Briarcliff Manor, NY (US); Rashmi Jha, Wappingers Falls, NY (US); Kathryn T. Schonenberg, Wappingers Falls, NY (US); Richard A. Conti, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 503 days.

(21) Appl. No.: 12/055,682

(22) Filed: Mar. 26, 2008

(65) Prior Publication Data

US 2009/0243031 A1 Oct. 1, 2009

(51) Int. Cl.
*H01L 21/00* (2006.01)

(52) U.S. Cl. ......... 438/240; 438/197; 257/310; 257/544

(58) Field of Classification Search .......... 438/240, 438/197; 257/310, 544
See application file for complete search history.

(56) References Cited

U.S. PATENT DOCUMENTS

| | | | |
|---|---|---|---|
| 5,479,033 A | 12/1995 | Baca et al. | |
| 6,326,251 B1 * | 12/2001 | Gardner et al. | 438/197 |
| 6,350,661 B2 | 2/2002 | Lim et al. | |
| 6,617,624 B2 | 9/2003 | Powell | |
| 6,649,480 B2 | 11/2003 | Fitzgerald et al. | |
| 6,713,808 B2 * | 3/2004 | Wang et al. | 257/310 |
| 6,881,632 B2 | 4/2005 | Fitzgerald et al. | |
| 7,109,079 B2 * | 9/2006 | Schaeffer et al. | 438/199 |
| 7,115,959 B2 * | 10/2006 | Andreoni et al. | 257/410 |
| 7,173,312 B2 | 2/2007 | Cabral, Jr. et al. | |
| 7,173,320 B1 | 2/2007 | Rahim | |
| 2006/0001161 A1 * | 1/2006 | Graettinger et al. | 257/751 |
| 2006/0131675 A1 | 6/2006 | Wang et al. | |
| 2006/0186491 A1 | 8/2006 | Park et al. | |
| 2007/0152276 A1 * | 7/2007 | Arnold et al. | 257/369 |
| 2007/0264837 A1 | 11/2007 | Rachmady et al. | |
| 2008/0014730 A1 * | 1/2008 | Arghavani et al. | 438/595 |
| 2010/0041221 A1 * | 2/2010 | Arnold et al. | 438/585 |

OTHER PUBLICATIONS

H. Ishii, et al. Growth and Electrical Properties of Atomic-Layer Deposited ZrO2/Si-Nitride Stack Gate Dielectrics. Journal of Applied Physics, Jan. 15, 2004 pp. 536-542.
Search Report and Written Opinion of FIS920070375PCT, International Serial No. PCT/US09/037620.
A. Nakajima, et al. Atomic-Layer Deposition of ZrO2 with a Si Nitride Barrier Layer, Applied Physics Letters, Oct. 7, 2002, 81(15):2824-2826.

* cited by examiner

*Primary Examiner* — Jarrett J Stark
*Assistant Examiner* — Nicholas Tobergte
(74) *Attorney, Agent, or Firm* — Scully, Scott, Murphy & Presser, P.C.; H. Daniel Schnurmann

(57) ABSTRACT

In one embodiment, the present invention provides a method of fabricating a semiconducting device that includes providing a substrate including at least one semiconducting region and at least one oxygen source region; forming an oxygen barrier material atop portions of an upper surface of the at least one oxygen region; forming a high-k gate dielectric on the substrate including the at least one semiconducting region, wherein oxygen barrier material separates the high-k gate dielectric from the at least one oxygen source material; and forming a gate conductor atop the high-k gate dielectric.

22 Claims, 5 Drawing Sheets

STRUCTURE AND METHOD TO CONTROL OXIDATION IN HIGH-K GATE STRUCTURES

FIELD OF THE INVENTION

In one embodiment, the present invention relates to semiconducting structures and devices.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, in which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain of the device are typically formed by adding dopants to targeted regions of a semiconductor body on either side of the channel. A gate electrode structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate electrode.

Continuing trends in semiconductor device manufacturing include a reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling through the thin gate dielectric. In addition, there are conventional limitations on the ability to form thin dielectric films with uniform thickness. Furthermore, thin $SiO_2$ gate dielectric layers provide a poor diffusion barrier to dopants and may allow high boron dopant penetration from the underlying channel region of the silicon during fabrication of the source/drain regions.

Recent MOS and CMOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

SUMMARY OF THE INVENTION

The present invention, in one embodiment, provides a method of fabricating a semiconducting device having a high-k gate dielectric atop a Si-containing substrate, in which silicon oxide formation at an interface of the high-k gate dielectric and the Si-containing substrate is substantially minimized by the incorporation of an oxygen barrier material positioned between the oxygen source materials that are present in the substrate and the high-k gate dielectric that is positioned on the substrate. In one embodiment, the inventive method includes:

providing a substrate including at least one semiconducting region and at least one oxygen source region;

forming an oxygen barrier material atop a portion of an upper surface of the at least one oxygen source region;

forming a high-k gate dielectric on the substrate including the at least one semiconducting region, wherein the oxygen barrier material separates the high-k gate dielectric from the at least one oxygen source material; and forming a gate conductor atop the high-k gate dielectric.

In one embodiment, the oxygen source region produces at least one of $H_2O$, O atoms, and $O_2$. In one embodiment, the at least one oxygen source region is an oxide containing region that is positioned within the substrate and is adjacent to the at least one semiconducting region. In one embodiment, the oxygen source can be from the bulk fill of the isolation region, with subsequent thermal treatments driving oxygen from the fill into the overlying high K dielectric or the oxygen source can be from the surfaces of the isolation regions. In one embodiment, a mechanism by which excess oxygen can be bonded to the surface includes bonds containing Si or other atoms (X) that are near the surface that interact with $H_2O$ during manufacturing steps, such as aqueous process steps to leave adjacent X—OH bonds. In one embodiment, these bonds then give up oxygen or oxygen containing species into an overlying layer of high K dielectric or can recombine during subsequent thermal treatments thereby releasing oxygen in the form of $H_2O$ into the overlying high k dielectric layer. In one embodiment, in which the oxygen source is the isolation region, the isolation region is composed of silicon dioxide. In one embodiment, the oxygen barrier material comprises a silicon containing material. In one embodiment, the oxygen barrier material is composed of silicon nitride (SiN).

In one embodiment of the present method, the step of forming the oxygen barrier material includes depositing the oxygen barrier material on the at least one semiconducting region and on the at least one oxygen source region, wherein following deposition the oxygen barrier material is removed from the at least one semiconducting region using an etch process. In one embodiment, the etch process may be a selective etch process. In one embodiment, the oxygen barrier material is positioned overlying the at least one oxygen source region, wherein additional structures and materials may be present between the oxygen source region and the oxygen barrier material, so long as the oxygen barrier material prohibits oxygen from contacting the high-k gate dielectric. In another embodiment, the oxygen barrier material is positioned directly on the oxygen source region.

In one embodiment, the upper surface of the substrate includes an upper surface of at least one semiconducting region being substantially coplanar with an upper surface of the oxygen barrier material, wherein an edge of the oxygen barrier material is in direct physical contact with the at least one semiconducting region. In one embodiment, the high-k gate dielectric is in direct physical contact with the upper surface of the at least one semiconducting region and at least a portion of the high-k gate dielectric is in direct physical contact with the oxygen barrier material.

In another aspect of the invention, a method of fabricating a semiconducting device is provided, in which an oxygen barrier material is positioned between a high-k gate dielectric and an isolation region that includes an oxygen containing composition. In one embodiment, the method includes:
providing a substrate including at least one semiconducting region and at least one isolation region, the at least one semiconducting region including a Si-containing region and the at least one isolation region includes an oxygen containing composition;
forming a layer of an oxygen barrier material positioned overlying the at least one isolation region and the at least one semiconducting region;
removing a portion of the oxygen barrier material that is positioned on the at least one semiconducting region to expose the Si-containing region; and
forming a gate structure positioned on the Si-containing region.

In one embodiment, the at least one semiconducting region further includes a sacrificial layer that is positioned atop the Si-containing region. In one embodiment, the present method further includes recessing the at least one isolation region to provide at least one recessed isolation surface, wherein the step of forming the layer of the oxygen barrier material positioned over the at least one semiconducting region includes forming the layer of the oxygen barrier material on the at least one recessed isolation surface. In one embodiment, following the formation of the oxygen barrier material and prior to removing a portion of the oxygen barrier material from the at least one semiconducting region, the method further includes forming a protective material atop the portion of oxygen barrier material that is positioned on the at least one recessed surface of the at least one isolation region, wherein the portion of the oxygen barrier material that is positioned on the at least one semiconducting region is exposed.

In one embodiment, removing the portion of the oxygen barrier material that is positioned on the at least one semiconducting region to expose the Si-containing region includes an etch process that removes the oxygen barrier material selective to the protective material. In one embodiment, following removal of the portion of the oxygen barrier material that is positioned on the at least one semiconducting region, the present method further includes removing the protective material to expose the oxygen barrier material that is positioned on the recessed surface of the at least one isolation region.

In one embodiment, forming the gate structure positioned on the Si-containing region includes forming a high-k gate dielectric on the substrate including the at least one semiconducting region, wherein the oxygen barrier material separates the high-k gate dielectric from the at least one isolation region, and forming a gate conductor atop the high-k gate dielectric.

In another aspect of the present invention, a method of fabricating a semiconductor device is provided, in which the oxygen barrier material is introduced to the structure during the formation of an isolation region, such as a shallow trench isolation region (STI). In one embodiment, the method includes:

forming a layered structure atop a substrate, the layered structure including a Si-containing region atop the substrate and a sacrificial layer atop the Si-containing region;
forming a first dielectric layer atop the layered structure and portions of the substrate adjacent the layered structure;
removing the first dielectric layer from a sidewall of the layered structure;
forming an oxygen barrier material that is present on the first dielectric layer on at least the portions of the substrate adjacent the layered structure and the sidewall of the layered structure;
removing the sacrificial layer and the oxygen barrier material present on the sacrificial layer to expose the Si-containing region, wherein a remaining portion of the oxygen barrier material is present on the first dielectric layer present on the portions of the substrate adjacent the layered structure; and
forming a gate structure atop the Si-containing region, the gate structure including a gate dielectric and a gate conductor atop the gate dielectric.

In one embodiment, the first dielectric layer atop the substrate adjacent to the layered structure is an isolation region. In one embodiment, a portion of the gate dielectric extends atop the remaining portion of the oxygen barrier material that is present on the first dielectric layer. In one embodiment, the step of removing the sacrificial layer and the oxygen barrier material that is present on the sacrificial layer includes depositing a second dielectric layer atop the oxygen barrier material, planarizing to remove the oxygen barrier material that is present on the sacrificial layer, etching the sacrificial layer selective to the second dielectric layer, and planarizing the second dielectric layer stopping on the remaining portion of the oxygen barrier material. In one embodiment, the oxygen barrier material is sealed to the sidewall of the Si-containing region, which may be a silicon containing layer.

The term "sealed to the sidewall" means that there is substantially no gap between the oxygen barrier material and the sidewall of the silicon containing layer. In one embodiment, the oxygen barrier material is sealed to the sidewall of the silicon containing layer, thereby eliminating the potential for the formation of a pathway for oxygen to get to the first dielectric layer.

In another aspect of the invention, a semiconductor device is provided that includes an oxygen barrier material positioned between the isolation regions of the device and a portion of a high-k gate dielectric that is overlying the isolations regions. In one embodiment, the device includes:
a substrate including an isolation region and a semiconducting region; a gate structure positioned on the substrate, the gate structure including a high-k gate dielectric, the high-k gate dielectric having a first portion that is in direct physical contact with at least a portion of the semiconducting region and a second portion that is separated from the isolation region substrate by a oxygen barrier material that is positioned at the interface of the high-k gate dielectric and the isolation region.

In one embodiment, the oxygen barrier material is positioned underlying the gate structure between the isolation region, i.e., an isolation region including an oxygen source region, and the high-k gate dielectric in the portions of the device where the gate structure overlies the isolation region. In one embodiment, in the portions of the device in which the gate is over the Si containing region, the oxygen barrier material is not present in the gate stack. In one embodiment, the edges of the oxygen barrier material that are substantially perpendicular to the gate length are the exterior ends of the oxygen barrier material, wherein the one or both of the exterior ends of the oxygen barrier material seal to the sidewalls of the semiconducting region at the interface of the semiconducting region and the isolation region. In another embodiment, when the gate region extends to overly the isolation regions, the edges of the exterior end of the oxygen barrier material extend over the portion of the isolation region that the gate region is extending over to separate the gate region from the isolation region.

In one embodiment, the high-k gate dielectric comprises $HfO_2$, hafnium silicate, hafnium silicon oxynitride or combinations thereof. In another embodiment, the high-k gate dielectric includes aluminates, such as Lanthanum aluminate, or titanates such as barium titanate, strontium titanate or barium strontium titanate. In another embodiment, the gate dielectric further includes oxides, silicates or silicon oxynitrides of zirconium, titanium, yttrium, lanthanum, tantalum, as well as combinations and multi-layers thereof, being applied alone, in combination, or in combination with the compounds discussed above. In one embodiment, the gate conductor comprises polysilicon and the metal interlayer comprises a metal, such as W, Ir, Re, Ru, Ti, Ta, Hf, Mo, Nb, Ni, Pt; a metal silicide, a metallic nitride, or a combination of the above.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
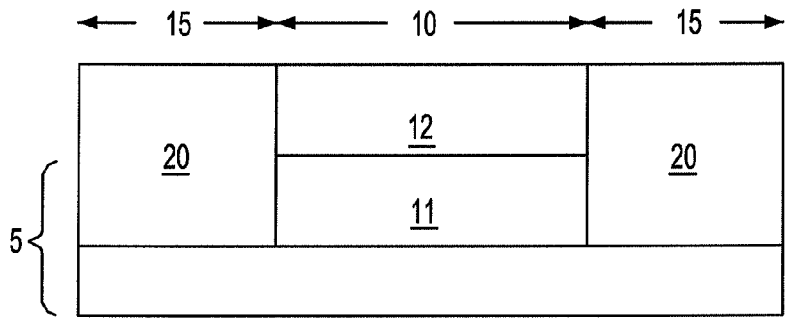
FIG. 1 is a side cross sectional view of an initial structure along the direction of travel of the gate of the subsequently formed device in which the initial structure includes a substrate having at least one device region, e.g., semiconducting region, and at least one oxygen source region, e.g. isolation region including an oxide containing composition, as used in accordance with at least one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods and structures relating to gate structures in semiconducting devices. When describing the inventive methods and structures, the following terms have the following meanings, unless otherwise indicated.

As used herein, "semiconductor region" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, a "P-type semiconductor" refers to the addition of trivalent impurities to an intrinsic semiconductor that creates deficiencies of valence electrons, such as the addition of boron, aluminum, or gallium to a type IV semiconductor, such as silicon.

As used herein, an "N-type semiconductor" refers to the addition of pentavalent impurities to an intrinsic semiconductor that contribute free electrons, such as the addition of antimony, arsenic, or phosphorous to a type IV semiconductor, such as silicon.

As used herein, an "oxygen barrier material" is a material that can not be substantially penetrated by oxygen in the form of $H_2O$, oxygen atoms, or $O_2$.

As used herein, the term "oxygen source region" denotes any material or structure present in the substrate that includes a structure that produces oxygen.

A "gate structure" means a structure used to control output current (i.e., flow of carriers in the channel) of a semiconducting device, such as a field effect transistor (FET).

As used herein, a "metal" is an electrically conductive material, which in the metal atoms are held together by the force of a metallic bond, and the energy band structure of the metal's conduction and valence bands overlap, and hence, there is no energy gap.

As used herein, the term "selective" in reference to a material removal process denotes that the rate of material removal for a first material is greater than the rate of removal for at least another material of the structure to which the material removal process is being applied.

As used herein, the term "non-selective" in reference to a material removal process denotes that the rate of material removal for a first material is substantially the same as the other materials of the structure to which the material removal process is being applied.

As used herein, a "gate dielectric" is a layer of an insulator between the semiconductor device substrate and the gate conductor.

As used herein, "high-K" denotes a dielectric material featuring a dielectric constant (k) higher than about 3.9.

As used herein, the term "dopant regions" refers to portions of a semiconductor material in which the electrical conductivity of the material is dependent upon n-type or p-type dopants.

As used herein, the term "isolation region" denotes a structure that electrically insulates a first semiconducting region from a second semiconducting region.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1 to 13 depict embodiments of the present method for forming a semiconducting device having a high-k gate dielectric 31, in which an oxygen barrier material 25 substantially reduces the incidence at which oxygen from oxygen source region 20, hereafter referred to as the oxygen source material, within the substrate 5, such as an oxide containing isolation region 20, migrate to the interface of the high-k gate dielectric 31 and the underlying Si-containing surface 11 to form an interfacial oxide.

FIG. 1 depicts an initial structure for one embodiment of the present method, in which the initial structure may include a substrate 5 including at least one semiconducting region 10 and at least one isolation region 15. In one embodiment, the at least one semiconducting region 10 includes a Si-containing layer 11 and a cap layer 12, which may also be referred to as a sacrificial layer. In one embodiment, the at least one isolation region 15 includes an oxide containing composition.

In one embodiment, the substrate 5 includes, but is not limited to: Si-containing materials, GaAs, InAs and other like semiconductors. Si-containing materials as used to provide the substrate 5 include, but are not limited to: Si, bulk Si, single crystal Si, polycrystalline Si, SiGe, amorphous Si, silicon-on-insulator substrates (SOI), SiGe-on-insulator (SGOI), strained-silicon-on-insulator, and annealed poly Si. In one embodiment in which the substrate 5 is a silicon-on-insulator (SOI) or SiGe-on-insulator (SGOI) substrate, the thickness of the Si-containing layer atop the buried insulating layer can have a thickness on the order of 10 nm or greater. In one embodiment, the SOI or SGOI substrate may be fabricated using a thermal bonding process, or in another embodiment may be fabricated by an ion implantation process. The substrate 5 may be n-type or p-type depending on the type of device to be fabricated. The substrate 5 may optionally include various active regions.

In one embodiment, the isolation regions 15 are formed in the substrate 5 using photolithography, etch and deposition processes. In one embodiment, the isolation regions 15 include an oxygen containing composition, such as an oxide, e.g. silicon oxide. In one embodiment, the isolation regions 15 may be shallow trench isolation regions. (STI). In one embodiment, the isolation regions 15 are formed by etching a trench in the substrate 5 utilizing an anisotropic etching process, such as reactive-ion etching (RIE). The term "anisotropic" denotes a material removal process in which the material removal rate in the direction normal to the surface of the material to be removed is greater than in the direction parallel to the surface of the material to be removed. Reactive ion etching is a form of plasma etching, in which during etching the surface to be etched is placed on an RF powered electrode, wherein the surface to be etched takes on a potential that accelerates the etching species that is extracted from a plasma towards the surface to be etched, in which a chemical etching reaction is taking place in the direction normal to the surface.

In one embodiment, a film stack (not shown) may be employed to provide an etch mask to produce the trenches for forming the isolation regions 15, wherein the number of layers in the film stack and their composition are selected to provide etch selectivity. The film stack may be patterned so as to form a hard mask having a geometry that provides the trench within the substrate in a subsequent etch step. More specifically, in one embodiment, a photoresist, not shown in the drawings, is formed on the exposed surface layer of substrate utilizing a conventional deposition process. The photoresist layer is then patterned utilizing conventional lithography so as to expose selective regions of the film stack in which trenches are to be formed. The lithography step employed in the present invention includes exposing the photoresist to radiation to form a pattern in the photoresist and developing the pattern. The trench is then formed by etching the various layers of the film stack utilizing a conventional dry etching process such as RIE, ion-beam etching, plasma etching or any other like dry etch process. A combination of the aforementioned dry etch processes may also be used in providing the trench. Following trench etch, the patterned photoresist is removed by a stripping process, such as oxygen ashing.

In one embodiment, the trenches may optionally be lined with a liner material, e.g., an oxide, and then chemical vapor (CVD) or another like deposition process is used to fill the trench with a dielectric material, such as oxide, e.g., silicon oxide. Chemical vapor deposition (CVD) is a deposition process in which a deposited species is formed as a result of chemical reactions between gaseous reactants at greater than room temperature (25° C. to 600° C.); wherein solid product of the reaction is deposited on the surface on which a film, coating, or layer of the solid product is to be formed.

In one embodiment the optional liner material may be formed by oxidizing the trench under conditions that are suitable for thermally growing a conformal oxide layer on the sidewalls of the trench. In one embodiment, the thermally grown conformal oxide layer is formed by oxidizing the structure in an oxygen-containing atmosphere such as $O_2$, ozone, $N_2O$ and other like oxygen-containing atmospheres at a temperature of about 800° C. or above for a time period of about 30 minutes or less. In another embodiment, the conformal oxide layer is formed by oxidizing the structure at a temperature of from about 900° C. to about 1000° C., for a time period of from about 5 to about 10 minutes. In addition to oxygen-containing atmospheres, the present invention also contemplates the presence of about 90% or less of an inert gas such as He, Ar or $N_2$ admixed with the oxygen-containing atmosphere. A thermally grown oxide layer may have a thickness ranging from about 10 nm to about 30 nm.

In a following process step, a trench dielectric material is formed in the trench utilizing a deposition processes including, but not limited to: CVD, plasma-assisted CVD, sputtering and other like deposition processes. Suitable trench dielectric materials that can be employed in the present invention include, but are not limited to: tetraethylorthosilicate (TEOS), $SiO_2$, flowable oxides and other like dielectric materials. When TEOS is employed, an optional densification step may be employed prior to planarization. In the embodiments depicted in the supplied drawings, the thermally grown oxide layer and trench dielectric material form STI region of the structure. It is noted that the deposition process employed in the filling the trench also forms a layer of the trench dielectric material on top of the nitride layer of the film stack. In one embodiment, the trench dielectric material is an oxygen source material 20. In one embodiment, the oxygen source material 20 is composed of an oxide, such as silicon dioxide.

In one embodiment, following dielectric fill, i.e., the formation of the oxygen source material 20, the structure is planarized down to the surface of the Si-containing layer 11 utilizing a planarization process, such as chemical-mechanical polishing (CMP) or grinding, which planarizes the substrate to the top of a sacrificial layer 12. Planarization is a material removal process that employs at least mechanical forces, such as frictional media, to produce a planar surface. Chemical Mechanical Planarization is a material removal process using both chemical reactions and mechanical forces to remove material and planarize a surface. In one embodiment, one or more wet etches may be employed after CMP to further planarize the structure down to the surface of the Si containing layer 11.

Still referring to FIG. 1, in one embodiment, the semiconducting region 10 includes a sacrificial layer 12 atop a Si-containing region 11, hereafter referred to as a Si-containing layer 11. In one embodiment, a portion of substrate 5 is composed of the Si-containing layer 11. In one embodiment, the Si-containing layer 11 is composed of Si, bulk Si, single crystal Si, polycrystalline Si, SiGe, amorphous Si, silicon-on-insulator substrates (SOI), SiGe-on-insulator (SGOI), strained-silicon-on-insulator, and annealed poly Si. In another embodiment, the Si-containing layer 11 may be substituted with a GaAs containing layer, such as GaAs. In an even further embodiment, the Si-containing layer 11 may be substituted with an InAs layer or other like semiconductor layer. In one embodiment, the Si-containing layer 11 may have a thickness ranging from about 2 nm to about 120 nm and the underlying part of substrate 5 is composed of an insulator like silicon dioxide, or silicon dioxide on a silicon substrate to form an SOI substrate. In another embodiment, the Si-containing layer 11 is crystalline and overlies a crystalline silicon substrate to form a "bulk" substrate.

In one embodiment, the structure depicted in FIG. 1 is provided by a method in which the initial substrate (not shown) has a blanket, unpatterned Si containing layer, which is to become the patterned Si containing layer 11 of FIG. 1. In this embodiment, the blanket unpatterned Si containing layer is composed of a crystalline silicon layer or crystalline silicon substrate with a topmost layer of surface silicon dioxide (not shown) of about 1 nm to about 10 nm in thickness. In this embodiment, a blanket layer of silicon nitride, which is to become patterned sacrificial layer 12 of FIG. 1, and which is from about 10 nm to about 100 nm in thickness is deposited on the substrate by CVD. A photoresist is patterned and reactive ion etching processes etch through the blanket silicon nitride layer and into or through the Si containing layer to yield the patterned sacrificial layer 12 and patterned silicon containing layer 11 of FIG. 1 and to yield trench regions which are to be filled to form oxygen source material 20. The photoresist is then stripped and silicon dioxide is formed in the trench regions and overlying sacrificial layer 12, as previously described. In a following process step, the structure of FIG. 1 is produced after the silicon dioxide is planarization by a CMP process that removes the silicon dioxide overlying sacrificial layer 12 leaves an oxygen source material 20 composed of silicon oxides having a topmost surface that is substantially planar with the topmost surface of silicon nitride layer 12.

Figure 2:
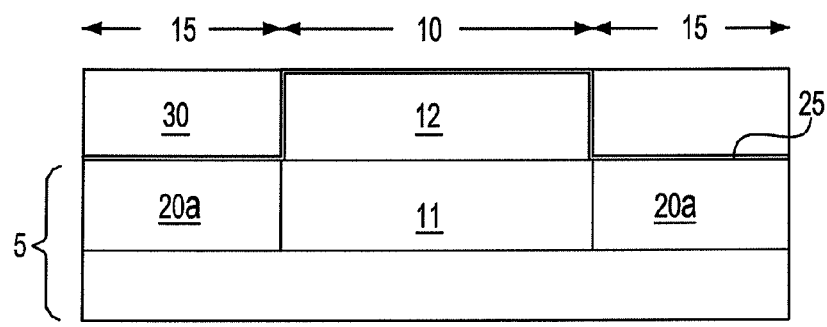
FIG. 2 is a side cross sectional view along the direction of travel of the gate of the subsequently formed device that depicts recessing the oxygen source region, e.g., isolation regions; forming an oxygen barrier layer atop the semiconducting region, overlying a covering pad nitride and the oxygen source region; and forming a protective material atop the recessed oxygen source region, e.g., recessed isolation region, in accordance with one embodiment of the present invention.

FIG. 2 depicts one embodiment of the structure depicted in FIG. 1 following a process sequence that includes recessing the oxygen source material 20 of the isolation regions 15; forming a oxygen barrier layer 25 atop the semiconducting region 10 and the isolation regions 15, and forming a protective material 30 atop the oxygen barrier layer 25 positioned on the recessed oxygen source material 20a.

In one embodiment, the oxygen source material 20 of the isolation regions 15 is recessed using an etch process that removes a portion of the oxygen source material 20 of the isolation regions 15 selective to the sacrificial layer 12. In one embodiment, the selective etch process includes an etch process including an etch chemistry that removes a silicon oxide containing oxide source material 20 selective to the nitride material of the sacrificial layer 12. In one embodiment, the selective etch process includes an etch comprising aqueous HF. In one embodiment, the selective etch process includes a gaseous etch comprising a mixture of gaseous HF and ammonia. For example, the partial pressure of the HF and ammonia mixture can be between about 2 mTorr and about 12 mTorr and can have an HF:ammonia ratio of about 2:1. The HF and ammonia gasses can be introduced to the substrate as HF and/or ammonia supply gasses or one or both of the HF and/or ammonia gasses can be formed by a plasma synthesis from precursor gasses such as $NF_3$ and ammonia. It is noted that the presence of other gasses in addition to HF and ammonia are not precluded. In one embodiment, the etch process includes a reactive ion etch process. In one embodiment, a selective etch process is followed by a less selective but anisotropic reactive ion etch process. In one embodiment, the upper surface of the oxide source material 20 of the isolation region is recessed below the topmost surface of the silicon-containing layer 11 by an amount equal to the thickness of the oxygen barrier layer 25. The amount of recess from the upper surface of the semiconductor region 10 (which may be the upper surface of the sacrificial layer 12) is therefore equal to the thickness of the sacrificial layer 12 plus the thickness of the oxygen barrier layer 25.

In a following process step, the oxygen barrier material 25 is formed atop the semiconducting region 10 and the isolation regions 15. In one embodiment, the oxygen barrier material 25 is composed of a material that provides a diffusion barrier to oxygen. In one embodiment, the oxygen barrier material 25 is composed of a Si containing material. In one embodiment, the oxygen barrier material 25 is composed of a silicon nitride containing material. In one embodiment, the oxygen barrier material 25 may be composed of any material that prevents a decrease in gate capacitance or prevents a reduction in drive current. For example, in one embodiment, the oxygen barrier material may be composed of Si nitride or Germanium nitride. In another example, the oxygen barrier material may be composed of a silicon/oxygen mixture with ratio greater than 1/2. In an even further embodiment, the oxygen barrier material may include at least one of silicon, Ge, reactive metals, metal nitrides, such as TiN, or TaN or Al and metal silicides or metal silicon nitrides. In one embodiment, the oxygen barrier material 25 may have a thickness ranging from about 0.5 nm to about 20 nm. In another embodiment, in particular when the sacrificial layer 12 cannot be removed selectively or can only be removed with poor selectivity to the barrier layer 25, then it is advantageous for a reduced thickness wherein the oxygen barrier material 25 may have a thickness ranging from about 0.5 nm to about 5.0 nm.

In one embodiment, the oxygen barrier material 25 is deposited by chemical vapor deposition (CVD). Variations of CVD processes include, but are not limited to: Atmospheric Pressure CVD (APCVD), Low Pressure CVD (LPCVD), Plasma Enhanced CVD (PECVD), Metal-Organic CVD (MOCVD) and combinations thereof. In one embodiment, the oxygen barrier material 25 is deposited using a conformal deposition method. The term "conformal" denotes a layer having a thickness that does not deviate from greater than or less than 20% of an average value for the thickness of the layer. In another embodiment, the oxygen barrier material 25 is be deposited by physical vapor deposition. In one embodiment, physical vapor deposition (PVD) can include sputter deposition, molecular beam deposition, or evaporative deposition. Embodiments where the layer is plated or formed by other methods are possible.

Following the formation of the oxygen barrier material 25, a protective material 30 is deposited atop the portion of the oxygen barrier material 25 that is formed overlying the oxygen source material 20a of the isolation regions 15. In one embodiment, the protective material 30 is blanket deposited atop the substrate 5 including the sacrificial layer 12 of the at least one semiconducting region 10 and the oxygen source material 20a of the at least one isolation region 15. In one embodiment, the protective material 30 is composed of a dielectric material. In one embodiment, the protective material 30 is an oxide or an oxynitride material. In one embodiment, the protective material 30 may be composed of high-density plasma (HDP) CVD silicon oxide having a thickness ranging from about 10 nm to about 300 nm. Typically, high-density plasma (HDP) CVD is a chemical vapor deposition process that utilizes a low pressure (2-10-mTorr range) to achieve a high electron density ($10^{10}$ cm$^3$-$10^{12}$ cm$^3$) and a high fractional ionization rate ($10^{-4}$ to $10^{-1}$) for deposition. In another embodiment, the protective material 30 is formed by a deposition process including, for example, chemical vapor deposition (CVD), plasma-assisted CVD, evaporation, spin-on coating, or chemical solution deposition.

In the embodiments of the present invention in which the protective material 30 is formed overlying the isolation regions 15 of the substrate 5 and the semiconducting regions 10 of the substrate, a planarization process may be performed to remove the protective material 30 from the semiconducting region 10 of the substrate 5. In one embodiment, the planarization process includes chemical mechanical planarization (CMP). The planarization process is continued until an upper surface of the oxygen barrier material 25 that is positioned within the semiconducting region 10 of the substrate 5 is exposed, wherein the upper surface of the protective material 30 overlying the oxygen barrier material 25 positioned overlying the oxygen source material 20a in the isolation region 15 is substantially coplanar to the upper surface of the oxygen barrier material 25 overlying the sacrificial layer 12 in the semiconducting region 10 of the substrate 5, as depicted in FIG. 2. In one embodiment, a chemical mechanical process step further removes the oxygen barrier material 25 from the surface of the sacrificial layer 12.

Figure 3:
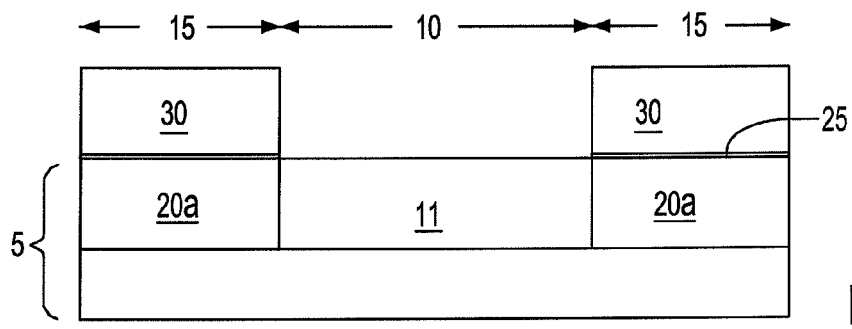
FIG. 3 is a side cross sectional view along the direction of travel along the gate of the subsequently formed device that depicts one embodiment of removing the oxygen barrier layer from the semiconducting region, in accordance with the present invention.

Referring to FIG. 3, in a following process step, the portion of the oxygen barrier material 25 that is positioned overlying the semiconducting region 10 of the substrate 5 as well as the sacrificial layer 12 are removed to expose the Si-containing layer 11. Note that the Si containing layer 11 can be comprised of a silicon dioxide layer overlying a crystalline layer. In one embodiment, the oxygen barrier material 25 is removed using a chemical mechanical planarization process. In one embodiment when the oxygen barrier layer 25 is a silicon:oxygen mixture with a ratio of about 4:3, the sacrificial layer 12 is silicon nitride and the protective material 30 is silicon dioxide. In one embodiment, the same chemical mechanical planarization process used to planarize protective material 30 also removes the oxygen barrier layer 25 to expose the silicon nitride sacrificial layer 12. In one embodiment, the silicon nitride sacrificial layer 12 is removed with a hot phosphoric acid etch having selectivity to the underlying Si-containing layer 11 and to the silicon dioxide protective material 30.

In another embodiment, the oxygen barrier material 25 is silicon nitride and the sacrificial layer 12 is silicon nitride. In this embodiment, the chemical mechanical process which planarizes the protective material 30 stops on the surface of oxygen barrier material 25 that overlies the sacrificial layer 12. In one preferred embodiment, the silicon nitride of both the sacrificial layer 12 and the overlying oxygen barrier material 25 is then removed with a reactive ion etch process that is selective to the silicon dioxide layer that is overlying a crystalline silicon layer of Si containing layer 11 and selective to the silicon dioxide of the protective material 30.

In another embodiment, the silicon nitride of both the sacrificial layer 12 and the overlying oxygen barrier material 25 is removed with a timed hot phosphoric acid step. In another embodiment, a etch process comprises a combination of a timed isotropic hot phosphoric acid etch of the silicon nitride of the sacrificial layer 12 followed by an anisotropic RIE step, wherein the portion of oxygen barrier layer 25 that underlies the silicon dioxide protective material 30 is not exposed to the isotropic hot phosphoric acid etch step.

It is noted that the above material combinations for protective material 30, oxygen barrier layer 25 and sacrificial layer 12 have been provided for illustrative purposes and are not intended to limit the present invention thereto, since other material combinations have been contemplated. For example, in one embodiment the oxygen barrier layer 25 is not removed by the chemical mechanical planarization process that planarizes protective material 30 and where the material of the oxygen barrier layer 25 differs from the material of the underlying sacrificial layer 12 and is not removed by the same etch process and etch chemistry used to remove sacrificial layer 12. In this instance, an additional etch process is needed to remove the oxygen barrier material.

In a following process step, well regions are formed in Si-containing layer 11 that is positioned in the semiconducting region 10 of the substrate 5. In one embodiment, well regions are produced via ion implantation with elements from group V of the Periodic Table of Elements or with elements from group III-A of the Periodic Table of Elements. Although not depicted in the Figures, these regions are within the scope of the present invention.

Figure 4:
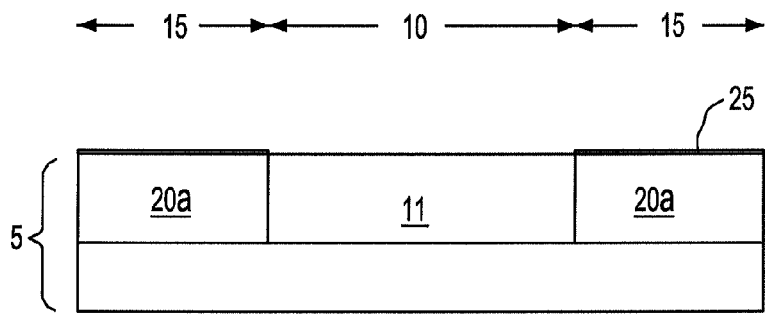
FIG. 4 is a side cross sectional view along the direction of travel along the gate of the subsequently formed device that depicts one embodiment of removing the protective material from the recessed oxygen source region, e.g., recessed isolation region, in accordance with the present invention.

Referring to FIG. 4, following implantation of the well dopant regions, the remaining protective material 30 may be removed from the isolation regions 10 of the substrate 5. In one embodiment, the remaining protective material 30 is removed by a selective etch, wherein the chemistry of the etch process removes the protective material 30 selective to the oxygen barrier material 25 overlying the oxygen source material 20a of the isolation regions 15 and the semiconduction part of the Si-containing layer 11 of the semiconducting region 10 of the substrate.

In one embodiment, the etch process comprises a wet etch. In one embodiment when the protective material 30 is composed of an oxide and the oxygen barrier material 25 is composed of silicon nitride, the wet etch chemistry includes a solution of hydrofluoric acid (HF). In another embodiment, the wet etch chemistry may include a hydrofluoric acid etch chemistry diluted with distilled water ($H_2O$) at a ratio of approximately 25:1 to approximately 500:1. In another embodiment, the wet etch chemistry includes a buffered hydrofluoric acid (HF). In one embodiment, the buffered HF wet etch chemistry may include ammonium fluoride as a buffer, wherein the HF/buffer ratio may range from about 9:1 to about 50:1. In yet another embodiment, the etch can comprise a gaseous mixture of HF and ammonia. In another embodiment, the etch process may include reactive ion etch. Typically these etches occur when preparing the surface prior to formation of the gate dielectric.

Figure 5:
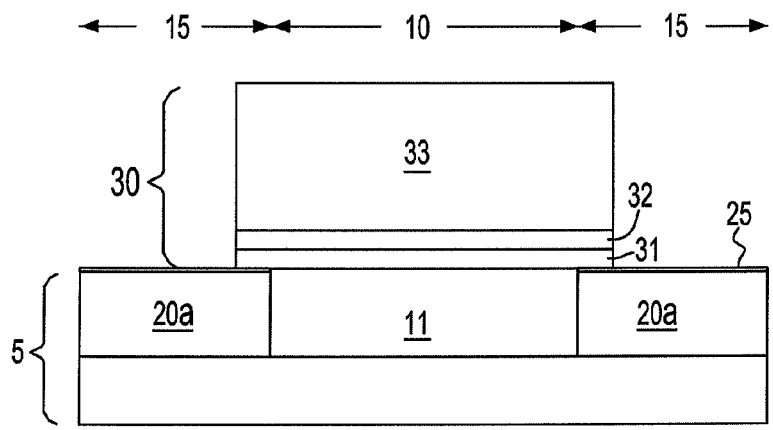
FIG. 5 is a side cross sectional view along the direction of travel along the gate of the subsequently formed device that depicts one embodiment of forming a gate structure atop the exposed Si-containing surface of the device region, in accordance with the present invention.
Figure 6:
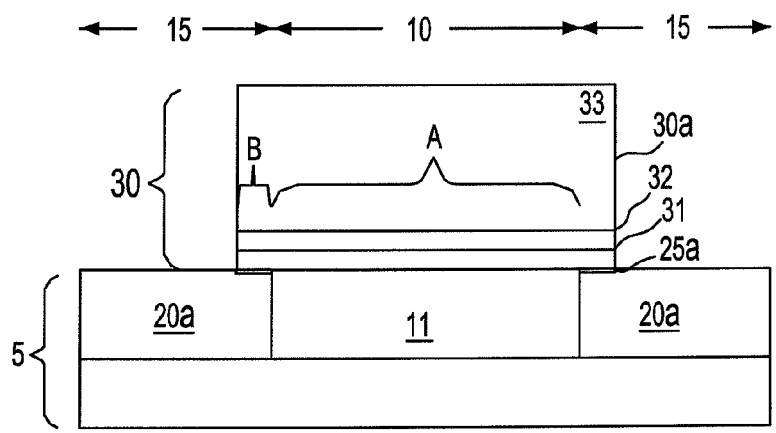
FIG. 6 is a side cross sectional view along the direction of travel along the gate of the device that depicts one embodiment of an etch step to remove the exposed portions of the oxygen barrier material using the gate structure as an etch mask, in accordance with the present invention.

Referring to FIG. 5, a gate structure 30 may be formed atop the silicon containing layer 11 within the semiconducting region 10 of the substrate 5 utilizing deposition and lithography processes. More specifically, in one embodiment, a gate structure 30 is provided atop the substrate 5 by depositing a gate dielectric layer 31 followed by a metal layer, and a gate conductor layer to provide a gate stack. In a following process step, the gate stack is patterned using photolithography and etch processes. For example, following the deposition of the gate dielectric layer, metal layer, and gate conductor layer, an etch mask is formed atop the gate conductor layer protecting the portion of the layered stack that provides the gate stack, wherein the portions exposed by the etch mask are removed by an anisotropic etch process, such as a reactive ion etch. In one embodiment, the etch mask may be provided by a patterned photoresist layer. In another embodiment, the etch mask may be a hard mask. In one embodiment in which the etch mask is a hard mask, the hard mask may be composed of silicon nitride.

In a following process step, source/drain regions are formed in Si-containing layer 11 that is positioned in the semiconducting region 10 of the substrate 5. In one embodiment, source/drain regions are formed via ion implantation and comprise a combination of normally incident and angled implants to form the desired grading. In one embodiment, PFET devices are produced within Si-containing substrates by doping the source/drain regions with elements from group V of the Periodic Table of Elements. In another embodiment, NFET devices are produced within Si-containing substrates by doping the source/drain regions with elements from group III-A of the Periodic Table of Elements. It is noted that the substrate 5 may further include extension dopant regions and halo dopant regions, as well as additional spacers utilized in forming extension dopant regions. Although not depicted in the Figures, these regions are within the scope of the present invention.

In one embodiment, the gate dielectric 31 of the gate stack is composed of an oxide material. Suitable examples of oxides that can be employed as the gate dielectric 31 include, but are not limited to: $SiO_2$, $Al_2O_3$, $ZrO_2$, $HfO_2$, $Ta_2O_3$, $TiO_2$, perovskite-type oxides and combinations and multi-layers thereof. In a further embodiment, the gate dielectric 31 may comprise of a nitride, oxynitride, or a combination (or multi layer) of oxide, nitride and oxynitride. In one embodiment, the gate dielectric 31 has a thickness greater than approximately 0.8 nm. In another embodiment, the gate dielectric 31 has a thickness ranging from about 1.0 nm to about 6.0 nm. In one embodiment, the gate dielectric 31 is formed using chemical vapor deposition (CVD) including, but not limited to: atomic layer CVD (ALCVD), pulsed CVD, plasma assisted CVD. In another embodiment, the gate dielectric 31 is formed by a thermal growing process, which may include oxidation, oxynitridation, nitridation, and/or plasma or radical treatment. In one embodiment, the gate dielectric 31 may be a high-k gate dielectric comprised of an insulating material having a dielectric constant of greater than about 3.9. In another embodiment, the gate dielectric 31 is a high-k gate dielectric comprised of an insulating material having a dielectric constant greater than 7.0. In one embodiment, a high-k gate dielectric is provided by $HfO_2$, hafnium silicate, hafnium silicon oxynitride or combinations thereof. Further examples of high-k gate dielectrics include $ZrO_2$, $HfZrO_2$, La doped with Hf or Zr oxides, or La oxides containing Al, Ti, Ta.

In one embodiment, a metal layer may be formed atop the gate dielectric 31. In one embodiment, the metal layer may be composed of Ni, Co, Ti, Pt, W, Ir, Re, Ru, Ta, Hf, Mo, Nb, Al, or combinations and alloys thereof at well as multilayers thereof. In one embodiment, the metal nitride layer 32 is formed atop the gate dielectric 31. The metal nitride layer 32 may be composed of TiN, TaN, WN, or combinations and alloys thereof. In one embodiment, the metal nitride layer 32 may have a thickness ranging from about 1 nm to about 12 nm. In another embodiment, the metal nitride layer 32 may have a thickness ranging from about 2 nm to about 7 nm. In one embodiment, the deposition method of metal nitride layer includes chemical vapor deposition (CVD). In one embodiment, the metal nitride layer 32 is deposited by physical vapor deposition (PVD), which may include but is not limited to: sputter deposition, molecular beam epitaxial deposition, electron beam deposition and combinations thereof. The PVD process can occur in the presence of added reactive gasses in the chamber such as nitrogen. In another embodiment, the metal nitride layer 32 is deposited by chemical vapor deposition (CVD), which may include, but is not limited to: Atmospheric Pressure CVD (APCVD), Low Pressure CVD (LPCVD), Plasma Enhanced CVD (PECVD), Metal-Organic CVD (MOCVD) and combinations thereof. In one embodiment, the metal nitride layer 32 may be deposited using a conformal deposition method.

In one embodiment, the deposition method for forming the metal nitride layer 32 may include atomic layer deposition (ALD) or pulse CVD. In one embodiment when the metal nitride layer 32 is deposited by pulsed CVD (ALD), nitrogen and metal precursors are pulsed one after each other with optional neutral gas added in between the pulsing steps. Although a single metal layer 31 is depicted in each of the supplied figures, embodiments of the present invention have been contemplated in which the metal layer is omitted or in which the metal layer is a bilayer deposition of one or more metals.

In one embodiment, the gate conductor 33 of the gate structure 30 is composed of a silicon containing material, which may be polysilicon. As used herein, the term "polysilicon" denotes a material composed of multiple Si crystals. In another embodiment, the gate conductor 33 is composed of Si, SiGe, SiGeC or combinations thereof. In one embodiment, the gate conductor 33 is formed utilizing a deposition process, such as CVD and physical vapor deposition (PVD). In one embodiment, the gate conductor 33 is composed of a doped silicon containing material. The dopant can be elements from group III-A or group V of the Periodic Table of Elements. The dopant may be introduced during deposition of the lower gate conductor layer or following subsequent patterning and etching of the gate conductor 33. In one embodiment, the gate conductor 33 has a height ranging from about 3 nm to about 120 nm. Although a single gate conductor layer 33 is depicted in each of the supplied figures, embodiments of the present invention have been contemplated in which the gate conductor layer is omitted or in which the gate conductor layer is a bilayer deposition of silicon or other semiconductors or is composed of a metal, or multiple layers comprising metal, and semiconductor. In another embodiment, the gate conductor comprises polysilicon or a metal, and the metal interlayer comprises a metal including at least one of W, Ti, Pt, Ru, Ta, Ti, La or other lanthanide metals, or nitrides or silicides of the metal.

The gate structure 30 is then patterned utilizing conventional photolithography and etch process steps. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. If the oxygen barrier layer 25 is an insulator such as silicon nitride or silicon rich oxide then it is not necessary but it is possible to remove the barrier layer during the gate patterning steps (as shown in the figures). If the oxygen barrier layer 25 is a conductor or semiconductor, then it is necessary to remove the oxygen barrier layer at the same time the rest of the gate stack is patterned by using an additional RIE step which removes the barrier layer selectively to the isolation region 20a and selectively to exposed regions of the silicon containing layer which are out of the plane of FIG. 6.

Following etch, a semiconductor device is provided that includes a substrate including an isolation region 15 and a semiconducting region 10; a gate structure 30 positioned on the substrate 5, the gate structure 30 including a high-k gate dielectric 31, the high-k gate dielectric 31 having a first portion A that is in direct physical contact with at least a portion of the semiconducting region 10 and a second portion B that is separated from the isolation region 15 by an oxygen barrier material 25 that is positioned at the interface of the high-k gate dielectric 31 and the isolation region 15. In one embodiment, an exterior end 25a of the oxygen barrier material 25 is aligned with a sidewall 30a of the gate structure 30.

FIGS. 7-13 depict another embodiment of the present invention, in which the method includes introducing the oxygen barrier material 25 to the structure during the formation of an isolation region 15. In one embodiment, the method includes forming a layered structure 50 atop a substrate 5, the layered structure 50 including a Si-containing layer 11 atop the substrate 5 and a sacrificial layer 12 atop the Si-containing layer 11; forming a first dielectric layer 55 atop the layered structure 50 and portions of the substrate 5 adjacent the layered structure 50; removing the first dielectric layer 55 from a sidewall 51 of the layered structure 50; forming an oxygen barrier material 25 on the first dielectric layer 55 on at least the portions of the substrate 5 adjacent the layered structure 50 and the sidewall 51 of the layered structure 50; removing the sacrificial layer 12 and the oxygen barrier material 25 present on the sacrificial layer 12 to expose the Si-containing layer 11, wherein a remaining portion of the oxygen barrier material 25 is present on the first dielectric layer 55 present on the portions of the substrate adjacent the layered structure 50; and forming a gate structure 30 atop the Si-containing layer 11, the gate structure 30 including a gate dielectric 31 and a gate conductor 33 atop the gate dielectric 31.

Figure 7:
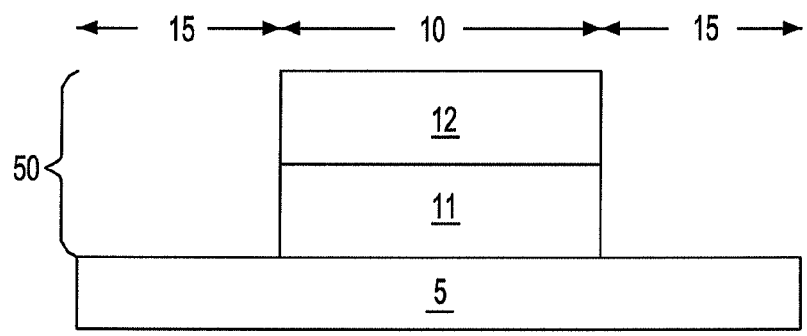
FIG. 7 is a side cross sectional view along the direction of travel along the gate of the subsequently formed device that depicts an initial structure for a second embodiment of the present invention, in which the oxygen barrier material is introduced to the structure during the formation of an isolation region.

FIG. 7 depicts one embodiment of an initial structure as used in accordance with the present invention, which includes a layered stack 50 atop a substrate 5. The substrate 5 materials described above with reference to FIGS. 1-7 are equally applicable to the embodiments depicted in FIGS. 7-13. In one embodiment, the substrate 5 may be composed of a Si-containing material.

In one embodiment, the layered stack 50 is composed of a Si-containing layer 11 atop the substrate 5 and a sacrificial layer 12 atop the Si-containing layer 11. In one embodiment, the Si-containing layer 11 is composed of Si, bulk Si, single crystal Si, polycrystalline Si, SiGe, amorphous Si, silicon-on-insulator substrates (SOI), SiGe-on-insulator (SGOI), strained-silicon-on-insulator, and annealed poly Si. In another embodiment layer, the Si-containing layer 11 may be substituted with a GaAs containing layer such as GaAs. In an even further embodiment, the Si-containing layer 11 may be substituted with an InAs layer or other like semiconductor layer. In one embodiment, the Si-containing layer 11 may have a thickness ranging from about 2 nm to about 120 nm and the underlying part of substrate 5 is composed of an insulator like silicon dioxide or silicon dioxide on a silicon substrate to form an SOI substrate. In another embodiment, the Si-containing layer 11 is crystalline and overlies a crystalline silicon substrate to form a "bulk" substrate.

In one embodiment, the sacrificial layer 12 is a dielectric material. In one embodiment, the sacrificial layer 12 is composed of silicon nitride. In another embodiment, the sacrificial layer 12 may be composed of a blanket layer of silicon nitride, which is to become patterned sacrificial layer 12 of FIG. 1, and which is from about 10 nm to about 100 nm in thickness is deposited on the substrate by CVD.

In one embodiment, the layered stack 50 is formed utilizing photolithography and etch process steps. Specifically, a pattern is produced by applying a photoresist to the surface to the sacrificial layer 12; exposing the photoresist to a pattern of radiation; and then developing the pattern into the photoresist utilizing conventional resist developer. Once the patterning of the photoresist is completed, the sections of the sacrificial layer 12 and Si-containing layer 11 covered by the photoresist are protected, while the exposed regions are removed using a selective etching process that removes the unprotected regions.

Figure 8:
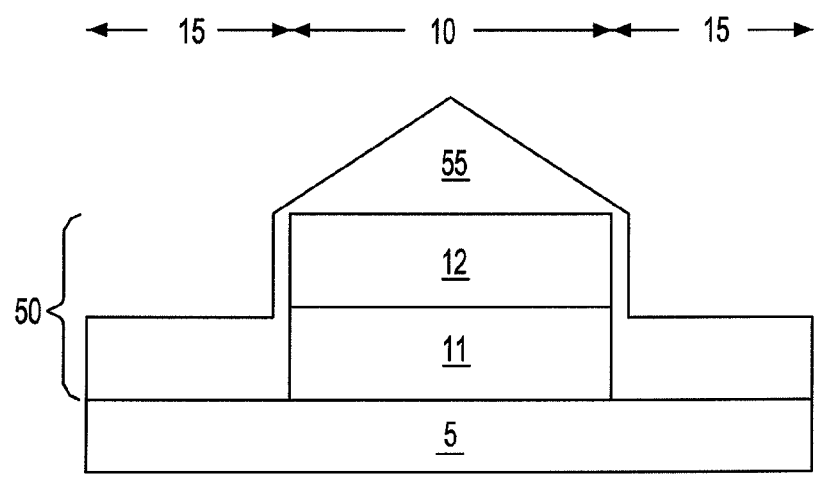
FIG. 8 is a side cross sectional view along the direction of travel along the gate of the subsequently formed device that depicts depositing a first dielectric layer atop the structure depicted in FIG. 7, in accordance with one embodiment of the present invention.

FIG. 8 depicts forming a first dielectric layer 55 atop the layered structure 50 and portions of the substrate 5 adjacent the layered structure 50. In one embodiment, the first dielectric layer 55 is composed of an oxide, nitride, oxynitride, or a combination thereof, as well as multi-layered structures thereof. In one embodiment, the first dielectric layer 55 is composed of silicon oxide. In one embodiment, the first dielectric layer is formed using chemical vapor deposition. In one embodiment, the first dielectric layer 55 is deposited using high-density plasma chemical vapor deposition (HDPCVD). HDPCVD is a chemical vapor deposition process that utilizes a low pressure (2-10-mTorr range) to achieve a high electron density ($10^{10}$ cm$^3$-$10^{12}$ cm$^3$) and a high fractional ionization rate ($10^{-4}$ to $10^{-1}$) for deposition.

In one embodiment, the portion of the first dielectric layer 55 formed on the portions of the substrate 5 adjacent the layered structure 50 provide a partially formed isolation region 15. In one embodiment, the portion of the first dielectric layer 55 that is positioned on the portions of the substrate 5 that are adjacent the layered structure 50 have a thickness tailored so that after the deposition of the oxygen barrier layer 25 in a subsequent step the top surface of the oxygen barrier layer 25 is approximately coplanar with the topmost surface of silicon containing layer 11.

Figure 9:
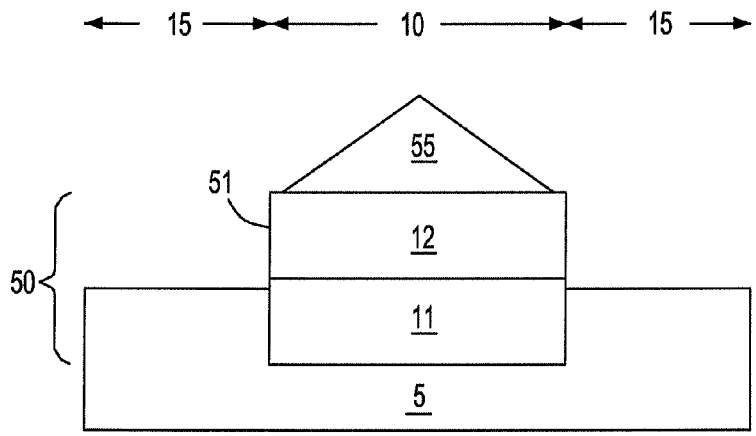
FIG. 9 is a side cross sectional view along the direction of travel along the gate of the subsequently formed device that depicts one embodiment of etching the first dielectric layer, from a semiconducting region to expose a sidewall of a Si containing surface, in accordance with the present invention.

Referring to FIG. 8, a portion of the first dielectric layer 55 that is present on the sidewall 51 of the layered stack 50 is removed using a selective etch process to yield the structure in FIG. 9. In one embodiment, the portion of the first dielectric layer 55 that is present on the sidewall of the layered stack 50 is removed using a chemical oxide etch removal (COR) process. Chemical oxide etch removal (COR) is used to selectively etch sacrificial oxide layers, e.g., thermal grown oxides and deposited oxide. The COR processing step comprises exposing the structure to a gaseous mixture of HF and ammonia at a pressure of about 30 mTorr or below, preferably at a pressure between about 1 mTorr and about 10 mTorr, and a temperature of about 20-25° C. or a temperature near room temperature. The ratio of gaseous HF to gaseous ammonia is from about 1:10 to about 10:1, with a ratio of about 2:1 being more highly preferred. A solid reaction product is formed as a result of the structure's exposure to HF and ammonia gas. The solid reaction product includes ammonium hexafluorosilicate, reactants or combinations thereof. The solid reaction product is removed in a second step which includes heating the structure to a temperature about 100° C., thus causing the reaction product to evaporate or rinsing the structure in water, or removing with an aqueous solution. In one embodiment, the first dielectric layer 55 is removed from the sidewall 51 of the layered stack 50, but the portion of the first dielectric layer 55 that provides the partial isolation region remains atop the substrate adjacent the layered stack, as well as a portion of the first dielectric layer 55 that is positioned atop the sacrificial layer 13 of the layered stack 50.

Figure 10:
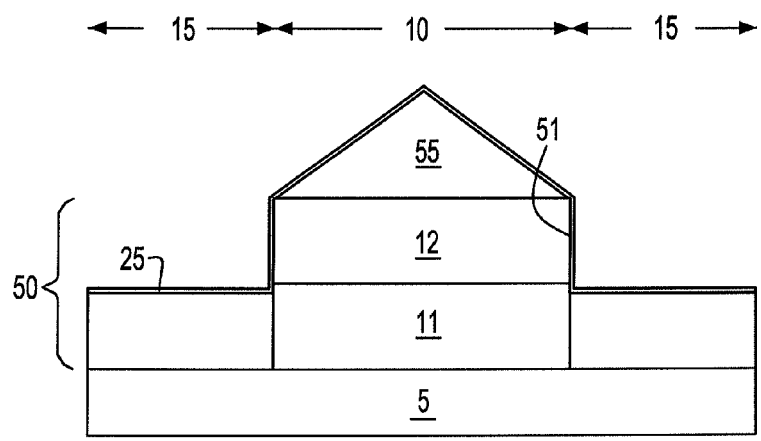
FIG. 10 is a side cross sectional view along the direction of travel along the gate of the subsequently formed device that depicts one embodiment of forming an oxygen barrier material atop a partially formed isolation region, in accordance with the present invention.

Referring to FIG. 9, in a following process step, the oxygen barrier material 25 is formed atop the semiconducting region 10 and the isolation regions 15 to yield the structure shown in FIG. 10. In one embodiment, the oxygen barrier material 25 is composed of a material that provides a diffusion barrier to oxygen.

In one embodiment, the oxygen barrier material 25 is composed of a Si containing material. In one embodiment, the oxygen barrier material 25 is composed of a silicon nitride containing material. In one embodiment, the oxygen barrier material 25 may be composed of any material that prevents a decrease in gate capacitance or prevents a reduction in drive current. For example, in one embodiment, the oxygen barrier material may be composed of Si nitride or Germanium nitride. In another example, the oxygen barrier material may be composed of a silicon:oxygen mixture with ratio greater than 1:2. In an even further embodiment, the oxygen barrier material may include at least one of silicon, Ge, reactive metals, metal nitrides, such as TiN, or TaN or Al and metal silicides or metal silicon nitrides. In one embodiment, the oxygen barrier material 25 may have a thickness ranging from about 0.5 nm to about 20 nm. In another embodiment, in particular when the sacrificial layer 12 cannot be removed selectively or can only be removed with poor selectivity to the barrier layer 25, then it is advantageous for a reduced thickness wherein the oxygen barrier material 25 may have a thickness ranging from about 0.5 nm to about 5.0 nm.

In one embodiment, the oxygen barrier material 25 is deposited by chemical vapor deposition (CVD). Variations of CVD processes include, but are not limited to: Atmospheric Pressure CVD (APCVD), Low Pressure CVD (LPCVD), Plasma Enhanced CVD (PECVD), Metal-Organic CVD (MOCVD) and combinations thereof. In one embodiment, the oxygen barrier material 25 is deposited using a conformal deposition method. In one embodiment, the oxygen barrier material 25 is deposited using physical vapor deposition (PVD) and can include sputter deposition, molecular beam epitaxial deposition, or electron beam deposition.

Figure 10A:
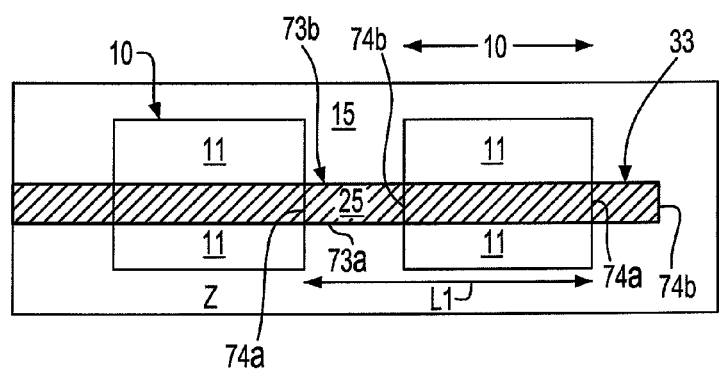
FIG. 10A is a planar top view at the surface of the substrate of one embodiment of the present invention that depicts sealing of the oxygen barrier material to the Si containing surface, in accordance with the present invention.

Referring to FIG. 10A, in one embodiment, the oxygen barrier material 25 is sealed to the sidewall of the Si containing layer 11 (also referred to as semiconductor layer). In one embodiment, the exterior edge 74a, 74b of the oxygen barrier layer 25 that is under the gate structure 33 is in direct physical contact and seals against the sidewall of silicon-containing layer 11. In one embodiment, the oxygen barrier material 25 is positioned underlying the gate structure 33 between the top surface of isolation region 15, i.e., an isolation region 15 comprising an oxygen source region, and the bottom surface of high-k gate dielectric 31 in the portions of the device where the gate structure 33 overlies the isolation regions 15. In one embodiment, in the portions of the device in which the gate structure 33 is over the Si containing layer 11, the oxygen barrier material 25 is not present. In one embodiment, the two edges 73a, 73b of the oxygen barrier material 25 that are underlying and are parallel to the sidewall of the gate structure 33 that extends in the direction of the gate length. The edges 74a, 74b of the oxygen barrier material 25 that are substantially perpendicular to the gate length L1 are the exterior ends of the oxygen barrier material 25, wherein the one or both of the exterior ends 74a, 74b of the oxygen barrier material 25 may seal to the sidewalls of the semiconducting layer 11 at the interface of the semiconducting layer 11 and the isolation region 15, or when the gate structure 33 extends to overly the isolation regions 15, the oxygen barrier material 25 extends over the portion of the isolation region 15 that the gate structure 33 is extending over thereby separating the gate structure 33 from the surface of isolation region 15. In one embodiment, the edges 74a, 74b are aligned with the interface of the semiconductor layer 11 and the isolation region 15.

Figure 11:
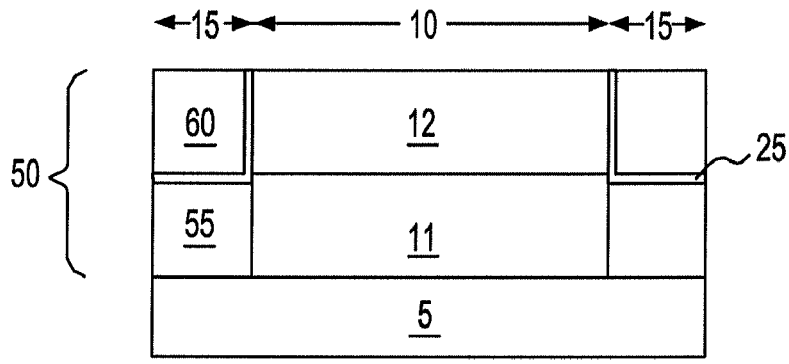
FIGS. 11 and 12 are side cross sectional views along the direction of travel along the gate of the subsequently formed device that depict one embodiment of depositing an additional dielectric layer and planarizing the structure and further removing a barrier material from a semiconducting region to expose a Si containing surface, in accordance with the present invention.
Figure 12:
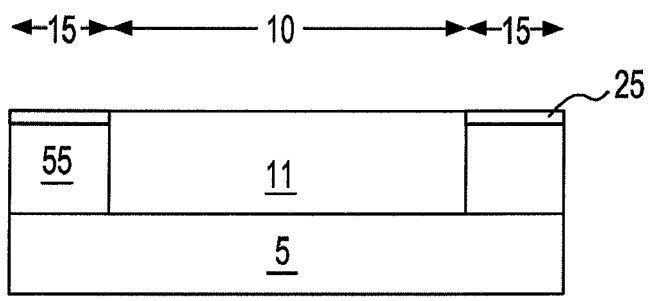

Referring to FIGS. 11 and 12, following the formation of the oxygen barrier material 25, the sacrificial layer 12 and the oxygen barrier material 25 that is present overlying the sacrificial layer 12 are removed to expose the Si-containing layer 11, wherein a remaining portion of the oxygen barrier material 25 is present on the first dielectric layer 55 overlying portions of the substrate 5 adjacent the layered structure 50.

Referring to FIG. 11, in one embodiment, removing the sacrificial layer 13, and the portion of oxygen barrier material 25 that is present on the sacrificial layer 12, includes depositing a second dielectric layer 60 atop the oxygen barrier material 25, and planarizing to remove the oxygen barrier material 25 that is present overlying the sacrificial layer 12 to provide a structure in which the upper surface of the second dielectric layer 60 is coplanar with the upper surface of the sacrificial layer 12.

In one embodiment, the second dielectric material 60 is deposited atop the portion of the oxygen barrier material 25 that is formed overlying the oxygen source material 55 of the isolation regions 15. In one embodiment, the second dielectric material 60 is blanket deposited atop the substrate 5 including the sacrificial layer 12 of the at least one semiconducting region 10 and the oxygen source material 55 of the at least one isolation region 15. In one embodiment, the second dielectric material 60 is an oxide or an oxynitride material. In one embodiment, the second dielectric material 60 may be composed of high-density plasma (HDP) CVD silicon oxide having a thickness ranging from about 10 nm to about 300 nm. In one embodiment, the second dielectric material 60 is planarized using chemical mechanical polishing (CMP).

Figure 13:
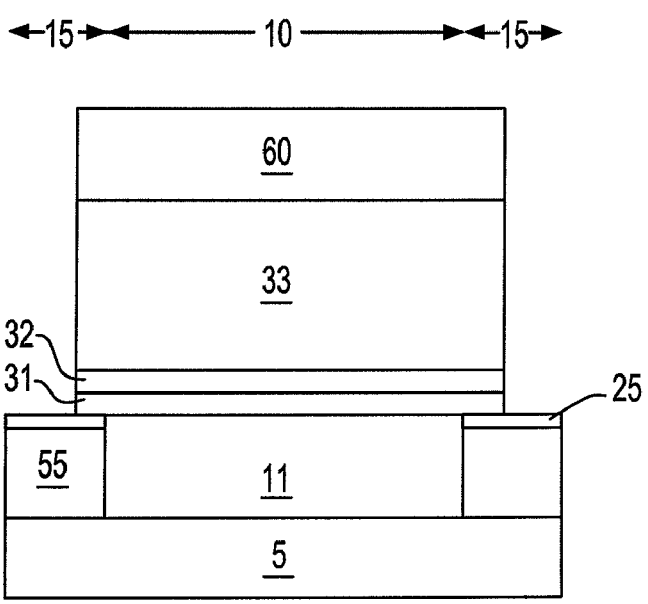
FIG. 13 a side cross sectional view along the direction of travel along the gate of the device that depicts one embodiment of forming a gate stack atop the Si containing surface depicted in FIG. 12, in accordance with the present invention.

FIG. 12 depicts one embodiment of etching the sacrificial layer 12 selective to the second dielectric layer 60 to expose the Si-containing layer 11; and planarizing the remaining portion of second dielectric layer 60 stopping on the remaining portion of the oxygen barrier material 25. In a following process step, well implant regions are formed in Si-containing layer 11 that is positioned in the semiconducting region 10 of the substrate 5. The formation of the well implant and source and drain regions described above with reference to FIGS. 1-7 is equally applicable to the embodiments depicted in FIGS. 7-13. In addition, a gate region 30 is formed atop the Si-containing layer 11, as depicted in FIG. 13. The gate region 30 may be formed using the methods and materials described above with reference to the embodiments depicted in FIGS. 1-7.

While the present invention has been particularly shown and described with respect to the preferred embodiments thereof, it will be understood by those skilled in the art that the foregoing and other changes in forms of details may be made without departing from the spirit and scope of the present invention. It is therefore intended that the present invention not be limited to the exact forms and details described and illustrated, but fall within the scope of the appended claims.

What is claimed:

1. A method of fabricating a semiconducting device comprising:
   providing a substrate including at least one semiconducting region and at least one oxygen source region;
   forming an oxygen barrier material atop portions of an upper surface of the at least one oxygen source region;
   forming a high-k gate dielectric on the substrate including the at least one semiconducting region, wherein oxygen barrier material separates the high-k gate dielectric from the at least one oxygen source; and
   forming a gate conductor atop the high-k gate dielectric.

2. The method of claim 1, wherein the oxygen barrier material comprises a silicon containing material.

3. The method of claim 1, further comprising a metal between the high-k gate dielectric and the gate conductor.

4. The method of claim 1, wherein the forming of the oxygen barrier material comprises: depositing the oxygen barrier material overlying the at least one semiconducting region and the at least one oxygen source region; and removing the oxygen barrier material from the at least one semiconducting region using an etch process.

5. The method of claim 4, wherein the etch process comprises a selective etch.

6. The method of claim 1, wherein the upper surface of the substrate includes an upper surface of the at least one semiconducting region being substantially coplanar with an upper surface of the oxygen barrier material, wherein an edge of the oxygen barrier material is in direct physical contact with the at least one semiconducting region.

7. The method of claim 6, wherein the high-k gate dielectric is in direct physical contact with the upper surface of the at least one semiconducting region and at least a portion of the high-k gate dielectric is in direct physical contact with the oxygen barrier material.

8. The method of claim 1, wherein the at least one oxygen source region is an oxide containing region.

9. A method of fabricating a semiconducting device comprising:
   providing a substrate including at least one semiconducting region and at least one isolation region, the at least one semiconducting region including a Si-containing layer and the at least one isolation region includes an oxygen containing composition;
   forming a layer of an oxygen barrier material positioned overlying the at least one isolation region and the at least one semiconducting region;
   removing a portion of the oxygen barrier material that is positioned on the at least one semiconducting region to expose the Si-containing layer, wherein a remaining portion of the oxygen barrier material is present on the at least one isolation region; and
   forming a gate structure positioned on the Si-containing layer, wherein a portion of the gate structure overlaps an upper surface of the at least one isolation region, and the remaining portion of the oxygen barrier material separates the portion of the gate structure that overlaps the at least one isolation region from the at least one isolation region.

10. The method of claim 9, wherein the at least one semiconducting region further includes a sacrificial layer atop the Si-containing layer.

11. The method of claim 10 further comprising recessing the at least one isolation region to provide at least one recessed isolation surface, wherein the forming of the layer of the oxygen barrier material positioned over the at least one semiconducting region includes forming the layer of the oxygen barrier material on the at least one recessed isolation surface.

12. The method of claim 11, wherein following the forming the layer of the oxygen barrier material and prior to the removing the portion of the oxygen barrier material that is positioned on the at least one semiconducting region, the method further comprises forming a protective material atop the portion of oxygen barrier material that is positioned on the at least one recessed surface of the at least one isolation region prior to the removing of the portion of the oxygen barrier, wherein the portion of the oxygen barrier material that is positioned on the at least one semiconducting region is exposed.

13. The method of claim 12, wherein the removing of the portion of the oxygen barrier material that is positioned on the at least one semiconducting region to expose the Si-containing layer comprises an etch process that removes the oxygen barrier material selective to the protective material.

14. The method of claim 13, wherein following the removing of the portion of the oxygen barrier material that is positioned on the at least one semiconducting region to expose the Si-containing layer, the method further comprises removing the protective material to expose the oxygen barrier material that is positioned on the recessed surface of the at least one isolation region.

15. The method of claim 14, wherein the forming of the gate structure positioned on the Si-containing layer comprises forming a high-k gate dielectric on the substrate including the at least one semiconducting region, wherein oxygen barrier material separates the high-k gate dielectric from the at least one isolation region; and forming a gate conductor atop the high-k gate dielectric.

16. The method of claim 15, further comprising a metal between the high-k gate dielectric and the gate conductor.

17. The method of claim 9, wherein the oxygen barrier material comprises a silicon containing material.

18. A method of fabricating a semiconducting device comprising:
    forming a layered structure atop a substrate, the layered structure including a Si-containing layer atop the substrate and a sacrificial layer atop the Si-containing layer;
    forming a first dielectric layer atop the layered structure and portions of the substrate adjacent the layered structure;
    removing the first dielectric layer from a sidewall of the layered structure;
    forming an oxygen barrier material on the first dielectric layer on at least the portions of the substrate adjacent the layered structure and the sidewall of the layered structure;
    removing the sacrificial layer and the oxygen barrier material that is present on the sacrificial layer to expose the Si-containing layer, wherein a remaining portion of the oxygen barrier material is present on the first dielectric layer present on the portions of the substrate adjacent the layered structure; and
    forming a gate structure atop the Si-containing layer, the gate structure including a gate dielectric and a gate conductor atop the gate dielectric.

19. The method of claim 18, wherein a portion of the gate dielectric extends atop the remaining portion of the oxygen barrier material present on the first dielectric layer.

20. The method of claim 18, wherein the removing of the sacrificial layer and the oxygen barrier material present on the sacrificial layer comprises depositing a second dielectric layer atop the oxygen barrier material; planarizing to remove the oxygen barrier material present on the sacrificial layer; etching the sacrificial layer selective to the second dielectric layer; and planarizing the second dielectric layer stopping on the remaining portion of the oxygen barrier material.

21. The method of claim 18, wherein the first dielectric layer atop the substrate adjacent to the layered structure is an isolation region.

22. The method of claim 21, wherein the oxygen barrier material is sealed to the sidewall of the isolation region.

* * * * *